United States Patent
Bhutta

(10) Patent No.: US 9,745,660 B2
(45) Date of Patent: Aug. 29, 2017

(54) METHOD FOR CONTROLLING A PLASMA CHAMBER

(71) Applicant: Reno Technologies, Inc., Wilmington, DE (US)

(72) Inventor: Imran Ahmed Bhutta, Moorestown, NJ (US)

(73) Assignee: RENO TECHNOLOGIES, INC.

( * ) Notice: Subject to any disclaimer, the term of this patent is extended or adjusted under 35 U.S.C. 154(b) by 142 days.

(21) Appl. No.: 14/702,900

(22) Filed: May 4, 2015

(65) Prior Publication Data

US 2015/0318223 A1 Nov. 5, 2015

Related U.S. Application Data

(60) Provisional application No. 61/987,725, filed on May 2, 2014.

(51) Int. Cl.
| | |
|---|---|
| *C23C 16/52* | (2006.01) |
| *C23C 16/505* | (2006.01) |
| *H01L 21/66* | (2006.01) |
| *H01J 37/32* | (2006.01) |

(52) U.S. Cl.
CPC ............ *C23C 16/505* (2013.01); *C23C 16/52* (2013.01); *H01J 37/32082* (2013.01); *H01J 37/3299* (2013.01); *H01J 37/32935* (2013.01); *H01L 22/26* (2013.01)

(58) Field of Classification Search
CPC .......... C23C 16/52; C23C 16/505; H05H 1/24
See application file for complete search history.

(56) References Cited

U.S. PATENT DOCUMENTS

| | | | |
|---|---|---|---|
| 3,681,662 A | | 8/1972 | Spescha |
| 4,193,070 A | | 3/1980 | Oppel |
| 5,273,610 A | | 12/1993 | Thomas, III et al. |
| 5,467,013 A | | 11/1995 | Williams et al. |
| 5,556,549 A | | 9/1996 | Patrick et al. |
| 5,576,629 A | | 11/1996 | Turner et al. |
| 5,643,364 A | * | 7/1997 | Zhao ................. H01J 37/32082 118/723 E |
| 5,770,922 A | | 6/1998 | Gerrish et al. |
| 5,936,481 A | | 8/1999 | Fujii |
| 5,971,591 A | | 10/1999 | Vona et al. |
| 6,332,961 B1 | | 12/2001 | Johnson et al. |
| 6,449,568 B1 | | 9/2002 | Gerrish |
| 6,873,114 B2 | | 3/2005 | Avoyan et al. |
| 7,761,247 B2 | | 7/2010 | Van Zyl |
| 7,764,140 B2 | | 7/2010 | Nagarkatti et al. |
| 7,871,830 B2 | | 1/2011 | Johal et al. |
| 7,885,774 B2 | | 2/2011 | Swank |
| 7,981,257 B2 | | 7/2011 | Krauss et al. |
| 8,815,329 B2 | | 8/2014 | Ilic et al. |
| 8,890,537 B2 | | 11/2014 | Valcore, Jr. et al. |
| 2005/0212450 A1 | | 9/2005 | Martinez et al. |
| 2006/0170367 A1 | * | 8/2006 | Bhutta ..................... H05H 1/46 315/111.21 |
| 2006/0226786 A1 | | 10/2006 | Lin et al. |
| 2008/0228179 A1 | | 9/2008 | Eder et al. |
| 2010/0315064 A1 | * | 12/2010 | Kuthi ..................... H01J 37/321 324/111 |
| 2013/0221847 A1 | | 8/2013 | Choi |
| 2014/0159741 A1 | | 6/2014 | Bannwarth et al. |
| 2015/0091440 A1 | * | 4/2015 | Marakhtanov .... H01J 37/32183 315/111.21 |

OTHER PUBLICATIONS

Heckman, Randy, et al., "The Evolution of RF Power Delivery in Plasma Processing". Advance Energy Whitepaper, pp. 1-8, 1998.*
Han, Yufeng, et al., "Power accuracy and source-pull effect for a high-power RF generator". 67$^{th}$ ARTFG Conference, 2006, pp. 81-92.*
Lei, Fan, et al., "An amplitude modulated radio frequency plasma generator". Physics of Plasmas 24, 043513 (2017), pp. 1-7.*

* cited by examiner

*Primary Examiner* — Bret Chen
(74) *Attorney, Agent, or Firm* — The Belles Group, P.C.

(57) ABSTRACT

An system and method for controlling a plasma chamber includes operably coupling an RF generator to the plasma chamber, the RF generator providing an RF signal to a chamber input of the plasma chamber; measuring a parameter at the chamber input; determining a rate of change based on the measured parameter; detecting an excessive rate of change condition comprising the rate of change exceeding a reference rate of change; detecting a repetitive change condition comprising a predetermined number of the excessive rate of change conditions in a predetermined time; upon detection of the repetitive change condition, decreasing a power of the RF signal provided to the chamber input.

20 Claims, 4 Drawing Sheets

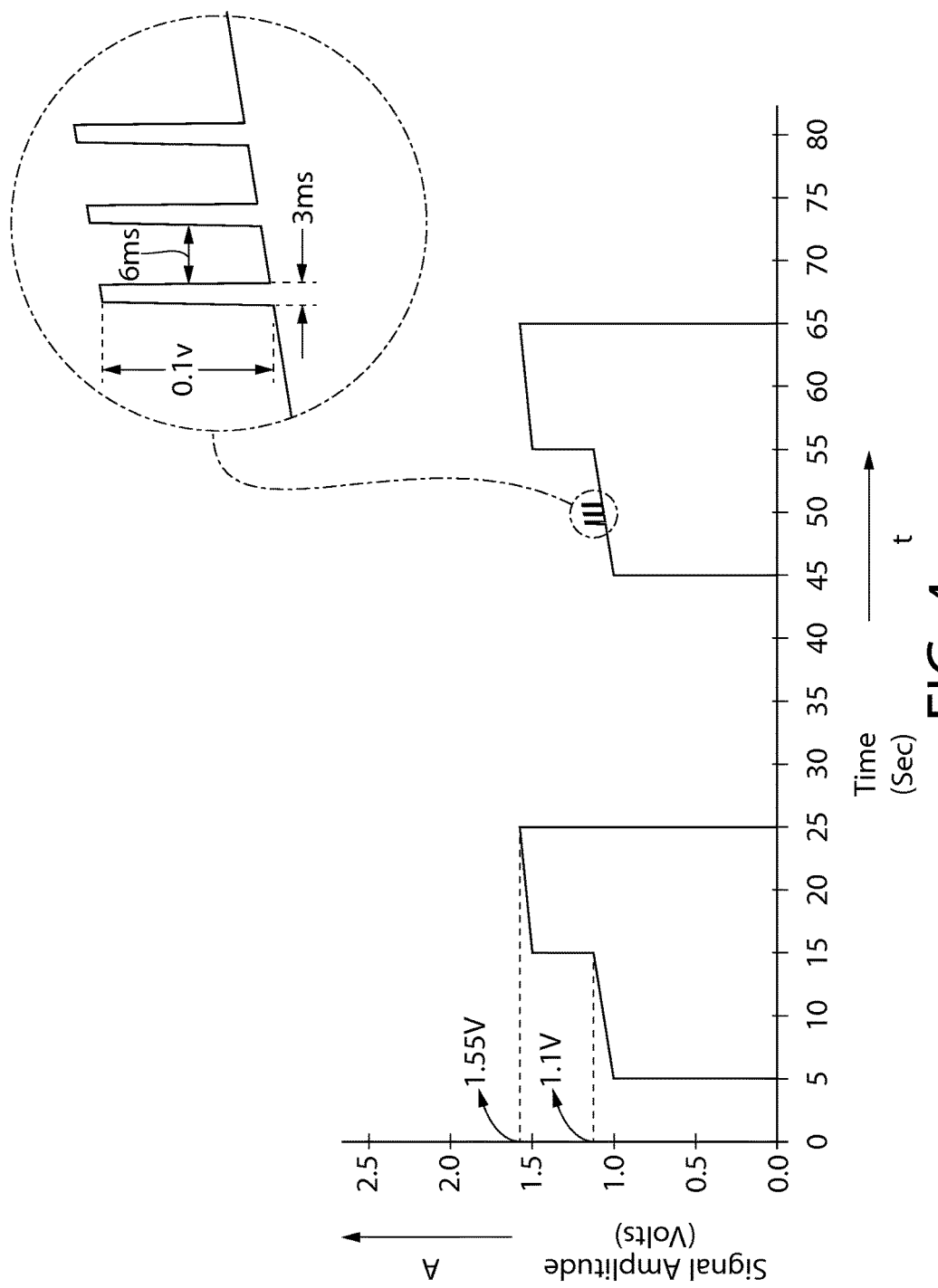

METHOD FOR CONTROLLING A PLASMA CHAMBER

CROSS REFERENCE TO RELATED APPLICATIONS

The present application claims priority to U.S. Provisional Patent Application Ser. No. 61/987,725, filed May 2, 2014, the disclosure of which is incorporated herein by reference in its entirety.

FIELD OF THE INVENTION

The field of the present invention relates to systems and methods for controlling a plasma chamber, including systems for controlling a plasma chamber used in semiconductor manufacturing.

BACKGROUND OF THE INVENTION

The semiconductor device fabrication process uses plasma processing at different stages to make semiconductor devices. Plasma processing involves energizing a gas mixture by imparting energy to the gas molecules by introducing radio frequency (RF) energy into the gas mixture. This gas mixture is typically contained in a vacuum plasma chamber, and the RF energy is typically introduced into the plasma chamber through electrodes.

In a typical plasma process, the RF generator generates power at a radio frequency—which is broadly understood as being within the range of 3 kHz and 300 GHz—and this power is transmitted through RF cables and networks to the plasma chamber. In order to provide efficient transfer of power from the RF generator to the plasma chamber, an intermediary circuit is used to match the fixed impedance of the RF generator with the variable impedance of the plasma chamber. Such an intermediary circuit is commonly referred to as an RF impedance matching network, or more simply as an RF matching network.

In plasma applications, conditions can arise where voltage builds up within the plasma chamber such that an electric arc occurs inside the plasma chamber. The voltage buildup can occur between the electrodes or between any two surfaces within the plasma chamber. The electrical arc can result in damage to the surface of the material being processed or even cause damage to other surfaces inside the chamber. Methods have been employed to detect arcing and to either preventing arcing from occurring in the first place or to limit the damage caused by arcing, but these methods are slow and often fail to capture fast transients.

Thus, there is need for a more reliable method of controlling the plasma chamber and the power provided thereto to prevent arcing and/or limit the damage caused by arcing.

SUMMARY OF THE INVENTION

The present invention is directed toward systems and methods for controlling a plasma chamber. Such systems and methods can be used in semiconductor processing, as well as in other applications.

In a first aspect of the present invention, a system for controlling a plasma chamber includes an RF generator operably coupled to a chamber input of the plasma chamber, the RF generator configured to provide an RF signal to the chamber input; a sensor component configured to measure a parameter at the chamber input; and a control unit configured to receive a sensor signal from the sensor component, the sensor signal indicative of the measured parameter; determine a rate of change based on the measured parameter; detect an excessive rate of change condition comprising the rate of change exceeding a reference rate of change; detect a repetitive change condition comprising a predetermined number of the excessive rate of change conditions in a predetermined time; and upon detection of the repetitive change condition, decrease a power of the RF signal provided to the chamber input.

In a second aspect of the present invention, a method for controlling a plasma chamber includes operably coupling an RF generator to the plasma chamber, the RF generator providing an RF signal to a chamber input of the plasma chamber; measuring a parameter at the chamber input; determining a rate of change based on the measured parameter; detecting an excessive rate of change condition comprising the rate of change exceeding a reference rate of change; detecting a repetitive change condition comprising a predetermined number of the excessive rate of change conditions in a predetermined time; upon detection of the repetitive change condition, decreasing a power of the RF signal provided to the chamber input.

In a third aspect of the present invention, a method of manufacturing a semiconductor includes placing a substrate in a plasma chamber configured to deposit a material layer onto the substrate or etch a material layer from the substrate; and energizing plasma within the plasma chamber by operably coupling an RF generator to the plasma chamber, the RF generator providing an RF signal to a chamber input of the plasma chamber, the RF signal having a current, a voltage, and a phase angle between the voltage and the current, and while energizing the plasma measuring a parameter at the chamber input; determining a rate of change based on the measured parameter; detecting an excessive rate of change condition comprising the rate of change exceeding a reference rate of change; detecting a repetitive change condition comprising a predetermined number of the excessive rate of change conditions in a predetermined time; and upon detection of the repetitive change condition, decreasing a power of the RF signal provided to the chamber input.

Accordingly, an improved method for controlling a plasma chamber, along with systems and methods incorporating same, is disclosed. Advantages of the improvements will be apparent from the drawings and the description of the preferred embodiment.

BRIEF DESCRIPTION OF THE DRAWINGS

The foregoing summary, as well as the following detailed description of the exemplary embodiments, will be better understood when read in conjunction with the appended drawings. It should be understood, however, that the invention is not limited to the precise arrangements and instrumentalities shown in the following figures:

FIG. 4 is a graph of voltage over time showing evidence of arcing in a plasma chamber.

DETAILED DESCRIPTION OF THE INVENTION

The description of illustrative embodiments according to principles of the present invention is intended to be read in connection with the accompanying drawings, which are to be considered part of the entire written description. In the description of embodiments of the invention disclosed herein, where circuits are shown and described, one of skill in the art will recognize that for the sake of clarity, not all desirable or useful peripheral circuits and/or components are shown in the figures or described in the description. Moreover, the features and benefits of the invention are illustrated by reference to the disclosed embodiments. Accordingly, the invention expressly should not be limited to such disclosed embodiments illustrating some possible non-limiting combinations of features that may exist alone or in other combinations of features; the scope of the invention being defined by the claims appended hereto.

As used throughout, ranges are used as shorthand for describing each and every value that is within the range. Any value within the range can be selected as the terminus of the range. In addition, all references cited herein are hereby incorporated by reference in their entireties. In the event of a conflict in a definition in the present disclosure and that of a cited reference, the present disclosure controls.

Figure 1:
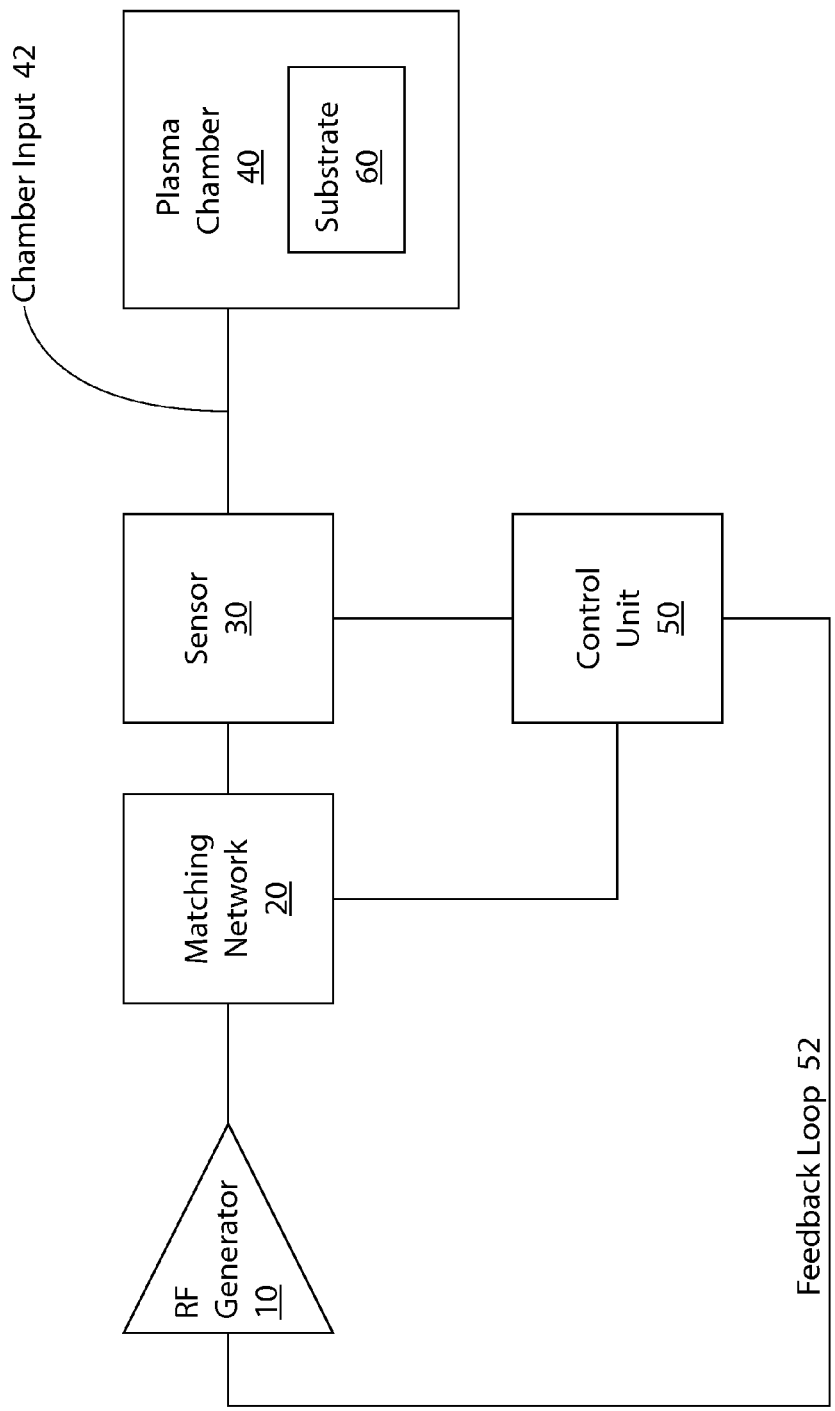
FIG. 1 is a block diagram of an embodiment of a system for controlling a plasma chamber.

Referring to FIG. 1, a block diagram of an embodiment of a system 5 for controlling a plasma chamber 40 is shown. In the exemplified embodiment, the plasma chamber 40 is configured to receive a substrate 60 for manufacturing a semiconductor. The semiconductor device can be a microprocessor, a memory chip, or other type of integrated circuit or device. The plasma chamber 40 can deposit a material layer onto the substrate 60 and/or etch a material layer from the substrate 60. While in the exemplified embodiment the plasma chamber 40 processes the substrate 60 for manufacture of a semiconductor device, in other embodiments, the plasma chamber 40 can be configured to process the surfaces of other devices, such as flat panel displays.

In the exemplified embodiment, the plasma chamber 40 is coupled to an RF generator 10. The RF generator 10 can be any device configured to generate an RF power that is provided to the plasma chamber 40 at chamber input 42. In the exemplified embodiment, the RF generator 10 includes an RF amplifier and a DC source. The RF amplifier can receive an RF signal at its RF input and a DC voltage at its DC input, and can output an RF power at its RF output. The RF amplifier uses the RF signal to modulate the power received at the DC input to provide an RF power that is higher than the power at the RF input. For manufacture of semiconductor devices, the RF power is typically within the range of 3 kHz and 300 GHz, though the invention is not so limited. The RF power can be transmitted through RF cables and networks to the plasma chamber 40.

In the exemplified embodiment, the RF power is transmitted to the plasma chamber 40 through an impedance matching network 20. The matching network 20 can help provide efficient transfer of power from the RF generator 10 to the plasma chamber 40. The matching network 20 can be any intermediary circuit used to help match the fixed impedance of the RF generator 10 with the variable impedance of the plasma chamber 40. Commonly owned U.S. patent application Ser. No. 14/669,568, the disclosure of which is incorporated herein by reference in its entirety, provides an example of such a matching network 20. In other embodiments, the matching network 20 can be omitted from the system 5.

The exemplified system 5 further includes a sensor or sensor component 30. The sensor 30 can be any device for measuring a parameter at the chamber input 42. The measured parameter can be any parameter (or parameters) measurable at the chamber input 42. In the exemplified embodiment, the sensor 30 detects the voltage and the current at the chamber input 42.

The exemplified system 5 further includes a control unit 50 that can be coupled to the sensor 30, matching network 20, and RF generator 10. In the exemplified embodiment, the control unit 50 can receive the sensor signal 301 from the sensor 30 and determine a phase angle between the voltage and the current of the RF signal. The control unit 50 can be configured to perform numerous other functions, which are described in more detail below.

The control unit 50 is configured with an appropriate processor and/or signal generating circuitry to provide signals for controlling the components of the system 5. In the exemplified embodiment, the control circuit 50 includes a processor. The processor may be any type of properly programmed processing device, such as a computer or microprocessor, configured for executing computer program instructions (e.g. code). The processor may be embodied in computer and/or server hardware of any suitable type (e.g. desktop, laptop, notebook, tablets, cellular phones, etc.) and may include all the usual ancillary components necessary to form a functional data processing device including without limitation a bus, software and data storage such as volatile and non-volatile memory, input/output devices, graphical user interfaces (GUIs), removable data storage, and wired and/or wireless communication interface devices including Wi-Fi, Bluetooth, LAN, etc. The processor of the exemplified embodiment is configured with specific algorithms to enable the system 5 to operate as described herein. The block diagrams of FIGS. 1 and 2 omit obvious components such as power supplies, as such components would be well known to a person of ordinary skill in the art.

Figure 2:
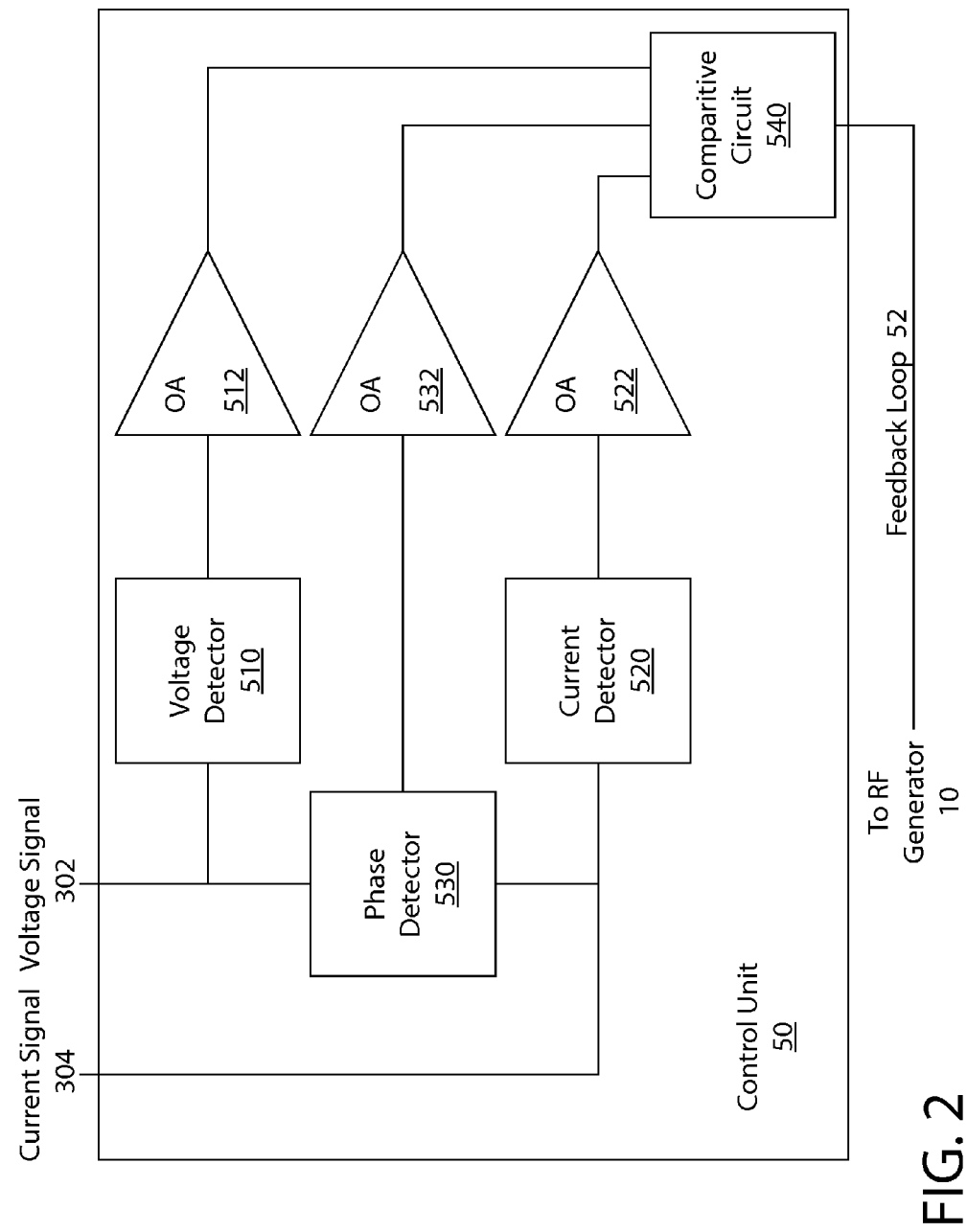
FIG. 2 is a block diagram of an embodiment of a control unit.

Referring now to FIG. 2, a block diagram of an embodiment of the control unit 50 is shown. The control unit 50 can be configured to receive a sensor signal 301 from the sensor 30, the sensor signal 301 being any signal or signals indicative of the measured parameter. In the exemplified embodiment, the sensor signal 301 includes two signals: (a) a voltage signal 302 (sometimes referred to as a first signal) that is indicative of the amplitude of the voltage of the RF signal at the chamber input 42 and (b) a current signal 304 (sometimes referred to as a second signal) that is indicative of the amplitude of the current of the RF signal at the chamber input 42.

The control unit 50 can include a voltage detector 510, a current detector 520, and a phase detector 530. The voltage detector 510 can receive the RF voltage signal 302 and convert it to an equivalent DC signal (the voltage DC signal). Similarly, the current detector 520 can receive the RF current signal 304 and convert it to an equivalent DC signal (the current DC signal). The phase detector 530 can receive both the RF voltage signal 302 and the RF current signal 304, determine the phase difference between the voltage and current, and output an equivalent DC signal (the phase DC signal).

The control unit 50 can further include operational amplifiers 512, 522, 532. These amplifiers can receive the DC signals from the voltage detector 510, current detector 520, and the phase detector 530 (the voltage DC signal, the current DC signal, and the phase DC signal), amplify these DC signals, and send the amplified DC signals to a comparative circuit 540.

The comparative circuit 540 can be any circuit capable of analyzing a measured parameter or a parameter based on the measured parameter. The analysis performed by the comparative circuit 540 of the control unit 50 will be discussed in further detail with regard to FIG. 3. Based on this analysis, the comparative circuit 540 can send a power control signal along a feedback loop 52 to the RF generator 10 to alter the power provided by the RF generator 10, thereby altering the power provided to the chamber input 42. In other embodiments, the feedback loop 52 and also (or alternatively) be coupled to the matching network 20 and can send a power control signal instructing the matching network 20 to alter the power provided to the chamber input 42. For example, if the matching network 20 used variable capacitors similar to those described in commonly owned U.S. patent application Ser. No. 14/669,568, one or more of the variable capacitors could alter its capacitance value to alter the RF signal provided at the chamber input 42. While the exemplified embodiment of FIG. 2 uses detectors, operational amplifiers, and a comparative circuit 540 to analyze the measured parameters, in other embodiments, alternative means can be used to perform this analysis.

Figure 3:
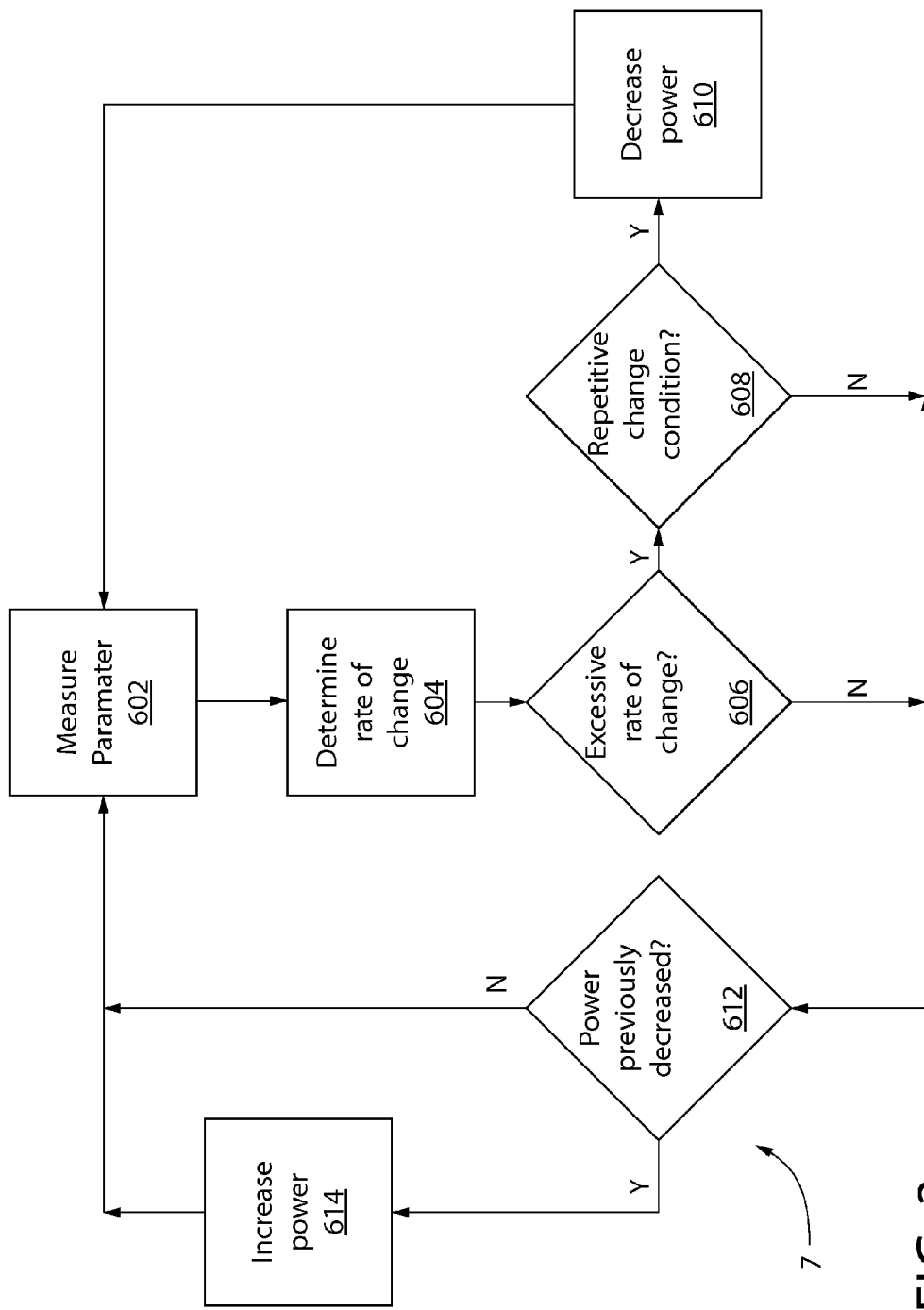
FIG. 3 is a flow chart of an embodiment of a method for controlling a plasma chamber.

Referring now to FIG. 3, a flow chart of an embodiment of a method 7 for controlling a plasma chamber 40 is shown. As indicated above, the sensor component 30 is configured to measure a parameter at the chamber input 42 and send a sensor signal 301 to the control unit 50, the sensor signal 301 indicative of the measured parameter (step 602). The measured parameter can be any parameter measurable at the chamber input 42. In the exemplified embodiment, the measured parameter is an amplitude of a voltage of the RF signal at the chamber input 42, and an amplitude of a current of the RF signal at the chamber input 42.

As plasma is ignited in a plasma chamber 40 by the introduction of RF power, the plasma characteristics change and the plasma presents a certain RF impedance at the chamber input 42. This impedance is a function of several parameters, including the amount of RF power delivered to the chamber, the type of gas in the chamber, the gas flow rate and the vacuum level in the chamber. As the voltages in the plasma rise to a sufficient level to cause an arc, the RF impedance presented at the chamber input 42 changes. As an arc occurs in the plasma chamber 40, it momentarily causes a short circuit in the local region in the plasma. This short circuit can result in one or more of the following: (a) an abrupt change in the amplitude of the RF voltage at the chamber input 42; (b) an abrupt change in the amplitude of the RF current at the chamber input 42; and (c) an abrupt change in the phase angle relationship between the RF voltage and RF current at the chamber input 42. Thus, such changes can be indicative of arcing in the plasma chamber 40.

Accordingly, the control unit 50 next determines a rate of change based on the measured parameter (step 604). The rate of change can be a rate of change of the measured parameter or a rate of change otherwise based on the measured parameter. In the exemplified embodiment, the control unit 50 determines the rate of change of the measured parameters (the voltage and current) and a rate of change of a parameter derived from the measured parameters (the phase angle). Specifically, the control unit 50 determines a rate of change of the amplitude of the voltage (the voltage rate of change), a rate of change of the amplitude of the current (the current rate of change), and a rate of change of the phase angle (the phase angle rate of change).

Next, the process detects an excessive rate of change condition (step 604). The excessive rate of change condition comprises the rate of change exceeding a reference rate of change. For example, in the exemplified embodiment, the control unit 50 determines the rate of change of the voltage (the voltage rate of change). The control unit 50 also receives a voltage reference rate of change, which is 1V/ms (or 1000V/s) in the exemplified embodiment. The voltage reference rate of change can represent a rate of change of the voltage that would not be regularly exceeded during normal (non-arcing) operation of the plasma chamber 40. Such reference rates of change can be used also for the current and phase angle, as well as for other measured parameters. In the exemplified embodiment, the excessive rate of change condition can comprise the voltage rate of change exceeding a reference voltage rate of change, the current rate of change exceeding a reference current rate of change, and/or the phase angle rate of change exceeding a reference phase angle rate of change. In other embodiments, other parameters and reference rates of change can be used.

Next, the process detects a repetitive change condition (step 608). The repetitive change condition can comprise a predetermined number of excessive rate of change conditions in a predetermined time. For example, in the exemplified embodiment, the control unit 50 monitors the voltage rate of change. The voltage rate of change will increase significantly when the RF generator 10 first begins providing an RF signal, or when the RF signal is discontinued, but these are isolated incidents. But if the voltage rate of change alters significantly several times over a predetermined period of time, this is indicative of arcing. The discussion of FIG. 4 provides an example of a repetitive change condition. In other embodiments, others predetermined numbers and predetermined times can be used based on the relevant system. In yet other embodiments, the repetitive change condition can be detected when the average rate of change over a predetermined time period exceeds a predetermined value.

If a repetitive change condition is detected, the process next decreases the power of the RF signal provided to the chamber input 42 (step 610), thereby reducing the voltage causing the arc. As discussed above, the control unit 50 can send a signal along a feedback loop 52 to the RF generator 10 and/or to the matching network 20 to alter the power provided to the chamber input 42). In other embodiments, the process can use alternative means to stop the occurrence of the arc in the chamber.

If an excessive rate of change condition is not detected (or a repetitive change condition was not detected), the process next determines whether the power was previously decreased (step 612). If it was not, the process returns to measuring the parameter (step 602). If, however, the power was previously decreased, and the repetitive change condition is no longer detected, the power can be increased back to the power used before the repetitive change condition was detected (step 614). In other embodiments, the process can use alternative means to alter the conditions at the chamber input 42 once arcing is no longer detected.

Referring now to FIG. 4, a graph showing evidence of arcing in a plasma chamber 40 is provided. The y-axis represents the voltage amplitude (in volts) of the RF signal at the chamber input 42. The x-axis represents time (in seconds). The graph shows two instances of the RF signal being turned ON and OFF, the first instance starting at approximately 5 seconds, and the second instance starting at approximately 45 seconds.

In the first instance (where there is no indication of arcing), the following occurs:

The RF signal is turned ON at approximately 5 seconds to 1V. It typically takes approximately 2 μs for the RF signal to increase from 0V to 1V. Thus, the voltage rate of change at this initial turning ON of the RF signal is 1V/2 μs or $5 \times 10^5$ V/s. In the exemplified embodiment, the reference rate of change is 1V/ms or 1000V/s. Thus, the rate of change at turning ON exceeds the reference rate of change, thereby constituting an excessive rate of change condition.

Over the next 10 seconds of operation, the voltage gradually rises from 1V to 1.1V, corresponding to a rate of change of 0.1V/10 s or 0.01 V/s ($1\times10^{-2}$ V/s). This rate of change is below the reference rate of change, and therefore would not constitute an excessive rate of change condition.

At 15 seconds, the voltage abruptly rises from 1.1V to 1.5V in approximately 2 µs. Thus, the rate of change at this stage is 0.4V/2 µs or $2\times10^5$ V/s. This abrupt rise in voltage can be due to many factors, such as a step in the plasma process requiring additional voltage. The rate of change is above the reference rate of change, and therefore would constitute an excessive rate of change condition.

Over the next 10 seconds of operation, the voltage gradually rises from 1.5 v to 1.55V, corresponding to a rate of change of 0.05V/10 s or 0.005V/s ($5\times10^{-3}$ V/s). This rate of change is below the reference rate of change, and therefore would not constitute an excessive rate of change condition.

Finally, at 25 seconds the voltage abruptly decreases from 1.55V to 0V in approximately 2 µs due to the RF signal being turned OFF. Thus, the rate of change at this stage is 1.55V/2 µs or $7.75\times10^5$. The rate of change is above the reference rate of change, and therefore would constitute an excessive rate of change condition.

Thus, in the first instance of the RF signal being turned ON and OFF, there are three excessive rate of change conditions: when the RF signal is turned ON (at 5 seconds), when the voltage is deliberately increased (at 15 seconds), and when the RF signal is turned OFF (at 25 seconds). But these excessive rate of change conditions do not repeat in a short period of time, and therefore are not indicative of arcing. Specifically, in the exemplified embodiment, a repetitive change condition indicative of arcing is detected if four excessive rate of change conditions occur in 2 seconds. In this first instance, however, three excessive rate of change conditions occur over 20 seconds. Thus, the repetitive change condition is not met.

In the second instance of the RF signal being turned ON and OFF, there is indication of arcing. As with the first instance discussed above, there are three abrupt changes spaced 10 seconds apart: when the RF signal is turned ON (at approximately 45 seconds), when the voltage is increased (at approximately 55 seconds), and when the RF signal is turned OFF (at approximately 65 seconds). These are each excessive rate of change conditions that occur over approximately 20 seconds. Also similar to the first instance, there are gradual rates of changes between 45 and 50 seconds, and between 55 and 65 seconds.

At approximately 50 seconds, however, additional excessive rate of change conditions occur. They are shown in more detail in the expanded view provided in FIG. 4. As can be seen, there are three spikes that last approximately 3 milliseconds and are separated by approximately 6 milliseconds. Each spike has a rise and fall of 0.1V, each occurring over approximately 2 microseconds, thus corresponding with a rate of change of approximately 0.1V/2 µs or $0.5\times10^5$ V/s. Thus, each rise or fall constitutes an excessive rate of change. As stated previously, in the exemplified embodiment, an arc is detected if four excessive rate of change conditions occur in 2 seconds. In this example, there are six excessive rate of change conditions in approximately 21 milliseconds, and therefore a repetitive change condition is detected. Thus, the system can respond by lowering the voltage provided at the chamber input 42. In other embodiments, repetitive change condition can be found based on a different number of excessive rate of change conditions, or based on a different time duration. Note also that certain changes in the rate of change of a parameter can happen so quickly that the system may not identify it as an excessive rate of change condition. For example, when a spike occurs, the system may identify the rise in the rate of change, but not the fall. Regardless of whether each change is detected, the system can carry out the process of detecting rate of change conditions and excessive rate of change conditions to the best of its ability to control the plasma chamber.

Unlike some other processes that encounter arcing, when RF power is applied to a typical plasma chamber, the impedance of the plasma chamber can vary between essentially open and essentially short. When the plasma is not ignited, the impedance appears to be large (essentially open), and when the plasma is ignited, the impedance drops to almost a short. In such a system, where the impedance is typically varying between these ranges, the characteristics of the RF signal (such as voltage, current, and phase angle) are also changing very rapidly. Further, arcing in a plasma chamber occurs when the plasma is operating, so the plasma chamber is typically operating into low impedances. Determining a short condition from low impedances is difficult. For these reasons, it is not obvious to monitor a plasma chamber's rate of change of characteristics such as voltage, current, and phase angle. But as is shown above, with close monitoring of these characteristics, detection of arcing can be achieved.

While the invention has been described with respect to specific examples including presently preferred modes of carrying out the invention, those skilled in the art will appreciate that there are numerous variations and permutations of the above described systems and techniques. It is to be understood that other embodiments may be utilized and structural and functional modifications may be made without departing from the scope of the present invention. Thus, the spirit and scope of the invention should be construed broadly as set forth in the appended claims.

What is claimed is:

1. A system for controlling a plasma chamber, the system comprising:
    an RF generator operably coupled to a chamber input of the plasma chamber, the RF generator configured to provide an RF signal to the chamber input;
    a sensor component configured to measure a parameter at the chamber input; and
    a control unit configured to:
        receive a sensor signal from the sensor component, the sensor signal indicative of the measured parameter;
        determine a rate of change based on the measured parameter;
        detect an excessive rate of change condition comprising the rate of change exceeding a reference rate of change;
        detect a repetitive change condition comprising a predetermined number of the excessive rate of change conditions in a predetermined time; and
        upon detection of the repetitive change condition, decrease a power of the RF signal provided to the chamber input.

2. The system of claim 1 wherein the measured parameter is one of:
    an amplitude of a voltage of the RF signal at the chamber input; and an amplitude of a current of the RF signal at the chamber input.

3. The system of claim 2 wherein the control unit is further configured to determine a phase angle between the voltage and the current of the RF signal.

4. The system of claim 3 wherein the rate of change is at least one of:
 a rate of change of the amplitude of the voltage (the voltage rate of change);
 a rate of change of the amplitude of the current (the current rate of change); and
 a rate of change of the phase angle (the phase angle rate of change).

5. The system of claim 4 wherein the excessive rate of change condition comprises one of:
 the voltage rate of change exceeding a reference voltage rate of change;
 the current rate of change exceeding a reference current rate of change; and
 the phase angle rate of change exceeding a reference phase angle rate of change.

6. A method for controlling a plasma chamber, the method comprising:
 operably coupling an RF generator to the plasma chamber, the RF generator providing an RF signal to a chamber input of the plasma chamber;
 measuring a parameter at the chamber input;
 determining a rate of change based on the measured parameter;
 detecting an excessive rate of change condition comprising the rate of change exceeding a reference rate of change;
 detecting a repetitive change condition comprising a predetermined number of the excessive rate of change conditions in a predetermined time; and
 upon detection of the repetitive change condition, decreasing a power of the RF signal provided to the chamber input.

7. The method of claim 6 wherein the measured parameter is one of:
 an amplitude of a voltage of the RF signal at the chamber input; and
 an amplitude of a current of the RF signal at the chamber input.

8. The method of claim 7 further comprising determining a phase angle between the voltage and the current of the RF signal.

9. The method of claim 8 wherein the rate of change is at least one of:
 a rate of change of the amplitude of the voltage (the voltage rate of change);
 a rate of change of the amplitude of the current (the current rate of change); and
 a rate of change of the phase angle (the phase angle rate of change).

10. The method of claim 9 wherein the excessive rate of change condition comprises one of:
 the voltage rate of change exceeding a reference voltage rate of change;
 the current rate of change exceeding a reference current rate of change; and
 the phase angle rate of change exceeding a reference phase angle rate of change.

11. The method of claim 10 further comprising:
 receiving a first signal from a sensor component, the first signal indicative of the amplitude of the voltage of the RF signal at the chamber input; and
 receiving a second signal from the sensor component, the second signal indicative of the amplitude of the current of the RF signal at the chamber input.

12. The method of claim 11 further comprising:
 receiving at a voltage detector the first signal from the sensor component, the voltage detector configured to output a voltage DC signal;
 receiving at a current detector the second signal from the sensor component, the current detector configured to output a current DC signal;
 receiving at a phase detector the first signal and the second signal from the sensor component, the phase detector configured to output a phase angle DC signal;
 receiving the current DC signal, the voltage DC signal, the phase angle DC signal, and a reference signal;
 detecting the excessive rate of change condition based on the current DC signal, the voltage DC signal, the phase angle DC signal, and the reference signal;
 sending a power control signal to the RF generator or a matching network to cause the decrease of the power of the RF signal provided to the chamber input.

13. The method of claim 12 wherein the power control signal is sent to the matching network, the matching network altering the capacitance value of a variable capacitor to decrease the power of the RF signal provided to the chamber input.

14. The method of claim 6 further comprising increasing the power of the RF signal provided to the chamber input when the repetitive change condition is no longer detected.

15. The method of claim 6 wherein an impedance matching network is coupled between the RF generator and the plasma chamber.

16. A method of manufacturing a semiconductor, the method comprising:
 placing a substrate in a plasma chamber configured to deposit a material layer onto the substrate or etch a material layer from the substrate; and
 energizing plasma within the plasma chamber by operably coupling an RF generator to the plasma chamber, the RF generator providing an RF signal to a chamber input of the plasma chamber, the RF signal having a current, a voltage, and a phase angle between the voltage and the current, and while energizing the plasma:
  measuring a parameter at the chamber input;
  determining a rate of change based on the measured parameter;
  detecting an excessive rate of change condition comprising the rate of change exceeding a reference rate of change;
  detecting a repetitive change condition comprising a predetermined number of the excessive rate of change conditions in a predetermined time; and
  upon detection of the repetitive change condition, decreasing a power of the RF signal provided to the chamber input.

17. The method of claim 16 wherein the measured parameter is one of:
 an amplitude of a voltage of the RF signal at the chamber input; and
 an amplitude of a current of the RF signal at the chamber input.

18. The method of claim 17 further comprising determining a phase angle between the voltage and the current of the RF signal.

19. The method of claim 18 wherein the rate of change is at least one of:

a rate of change of the amplitude of the voltage (the voltage rate of change);

a rate of change of the amplitude of the current (the current rate of change); and a rate of change of the phase angle (the phase angle rate of change).

20. The method of claim 19 wherein the excessive rate of change condition comprises one of:

the voltage rate of change exceeding a reference voltage rate of change;

the current rate of change exceeding a reference current rate of change; and the phase angle rate of change exceeding a reference phase angle rate of change.

\* \* \* \* \*